(12) United States Patent
Hegde et al.

(10) Patent No.: US 12,368,117 B2
(45) Date of Patent: Jul. 22, 2025

(54) ELECTROSTATIC DISCHARGE PREVENTION IN ION BEAM SYSTEM

(71) Applicant: Plasma-Therm NES LLC, St. Petersburg, FL (US)

(72) Inventors: Sarpangala Hariharakeshava Hegde, Fremont, CA (US); Armin Baur, Largo, FL (US); Wei-Hua Hsiao, St. Petersburg, FL (US); Russell Westerman, Land O' Lakes, FL (US); Jerome Michael Buckley, St. Petersburg, FL (US)

(73) Assignee: PLASMA-THERM NES LLC, St. Petersburg, FL (US)

( * ) Notice: Subject to any disclaimer, the term of this patent is extended or adjusted under 35 U.S.C. 154(b) by 163 days.

(21) Appl. No.: 18/119,125

(22) Filed: Mar. 8, 2023

(65) Prior Publication Data

US 2023/0343727 A1    Oct. 26, 2023

Related U.S. Application Data

(63) Continuation-in-part of application No. 17/727,723, filed on Apr. 23, 2022.

(51) Int. Cl.
*H01L 23/60* (2006.01)
*H01L 21/3065* (2006.01)

(52) U.S. Cl.
CPC .......... *H01L 23/60* (2013.01); *H01L 21/3065* (2013.01)

(58) Field of Classification Search
None
See application file for complete search history.

(56) References Cited

U.S. PATENT DOCUMENTS 5,986,264 A * 11/1999 Grunewald ............. H01J 37/28
                                                 250/492.21
6,355,494 B1 * 3/2002 Livengood ............. H01L 22/26
                                                 257/E21.53

* cited by examiner

*Primary Examiner* — Stephanie P Duclair
(74) *Attorney, Agent, or Firm* — Harvey S. Kauget; Burr & Forman LLP

(57) ABSTRACT

The present disclosure provides several methods for processing a substrate within a shutterless ion beam etching (IBE) system or shutterless ion assist ion beam deposition (IBD) system while preventing electrostatic damage to the substrate. In the IBE, at an etch completion, the ion energy to the ion source is reduced to less than 20 electron volts while at least one of the devices of the plurality of devices on the top surface of the substrate is exposed to a portion of the ion beam. In the IBD, at a deposition ion assist completion, the ion energy from the second ion source is reduced to less than 20 electron volts while at least one of the devices of the plurality of devices on the top surface of the substrate is exposed to the second ion beam.

6 Claims, 2 Drawing Sheets

ELECTROSTATIC DISCHARGE PREVENTION IN ION BEAM SYSTEM

CROSS-REFERENCE TO RELATED APPLICATION

This application is a continuation in part of U.S. patent application Ser. No. 17/727,723 entitled: VIRTUAL SHUTTER IN ION BEAM SYSTEM filed on Apr. 23, 2022, the contents of which are incorporated herein by reference in their entirety.

TECHNICAL FIELD

The present disclosure relates to the field of charged particle sources including plasma sources for direct etching and deposition, broad-beam ion sources for ion beam deposition and etching, and electron sources for surface modification.

BACKGROUND

As shown in FIG. 1A, a typical ion beam etching system 10 has a substrate 30 arranged on a wafer stage 20 that is irradiated with positive ions in an ion beam 40 from an ion source which etch the substrate 20. An ion beam etching system 10 includes an ion source which extracts positive ions from a plasma using an extraction electrode. The wafer stage 20 is placed at a position where the substrate squarely faces the ion beam 40 from the ion source under vacuum. In general, the ion beam etching system 10 also includes an electron source (neutralizer) which emits electrons to neutralize the positive ions extracted from the ion source. A physical shutter is mechanically moved into a position between the ion source and the wafer stage 20 wherein the physical shutter shields the substrate 30 from exposure to the ion beam 40 when the physical shutter is in the appropriate position. This shielding with the physical shutter can be done for a brief period of time to allow the ion beam 40 to be stabilized. Thus, the physical shutter is used to start and end the etching process within the ion beam etching system. In addition, the physical shutter device prevents the ion beam 40 from hitting the internal surfaces of the wafer stage that would be exposed to the ion beam 40 if no wafer stage 20 was present during the etching operation of the ion beam etching system 10.

As shown in FIG. 2A, a typical ion beam sputter deposition system 10, has an ion neutral source direct an ion beam 40 onto a sputtering target 45 which results in an energetic particle beam of sputtered material 42. A substrate 30 is arranged on a wafer stage 20 and is irradiated with the sputtered material 42 from the sputtering target 45 which deposits on the substrate 30. A physical shutter is mechanically moved into a position between the sputtered material 42 from the sputtering target 45 and the wafer stage 20 wherein the physical shutter shields the substrate 30 from exposure to the energetic particle beam of sputtered material 42 from the sputtering target 45. This shielding with the physical shutter can be done for a brief period of time to allow the energetic particle beam of sputtered material 42 from the sputtering target 45 to be stabilized. Thus, the physical shutter is used to start and end the deposition process within the ion beam deposition system 10. In addition, the physical shutter isolates the substrate 30 from the sputtering target 45 when the sputtering target is to be cleaned within the ion beam deposition system 10.

A typical substrate can include many devices and may be covered with photoresist masks or other type of masks. The devices can be processed with ion beam exposure to etch the desired shape of the devices on the substrate. Or, sputtered material from a target can be deposited on the substrate.

SUMMARY OF THE INVENTION

The present invention achieves a virtual shutter within a sputtering system using a unique method to eliminate the need for a physical shutter. In accordance with the present disclosure, the need for a physical shutter can be eliminated by tilting the substrate to angles greater than or equal to 90 degrees or less than or equal to minus 90 degrees in an ion beam system. These stated tilt angles of the substrate achieve a virtual shutter by "hiding" the substrate to an ion beam within an ion beam etching system or "hiding" the substrate to sputtered material from a target exposed to an ion beam in an ion beam deposition system.

According to one aspect of an embodiment of the present disclosure, a method of processing a substrate, the method comprising: placing the substrate on a wafer stage within an ion beam system, the substrate having a top surface having a plurality of features, an edge and a bottom surface; igniting an energetic particle beam having a radial flux distribution over at least a portion of a major dimension thereof; stabilizing the energetic particle beam while the wafer stage with the substrate is oriented so that the top surface of the substrate is at an angle of greater than 90 degrees to the major dimension of the energetic particle beam or less than minus 90 degree to the major dimension of the energetic particle beam; orienting the wafer stage with the substrate so that the top surface of the substrate is at an angle greater than 90 degrees or less than minus 90 degrees to the major dimension of the energetic particle beam after stabilization of the energetic particle beam; and exposing the plurality of features on the top surface of the substrate to the energetic particle beam while the wafer stage with the substrate is oriented so that the top surface of the substrate is at an angle greater than 90 degrees or less than minus 90 degrees to the major dimension of the energetic particle beam in a treatment zone.

According to another aspect of an embodiment of the present disclosure, a method of processing a substrate, the method comprising: placing the substrate on a wafer stage within an ion beam system, the substrate having a top surface having a plurality of features, an edge and a bottom surface; igniting an energetic particle beam having a radial flux distribution over at least a portion of a major dimension thereof; stabilizing the energetic particle beam while the edge of the substrate is normal to the major dimension of the energetic particle beam and while the edge of the substrate is exposed to the energetic particle beam; orienting the wafer stage with the substrate so that the top surface of the substrate is exposed to the major dimension of the energetic particle beam; and exposing the plurality of features on the top surface of the substrate to the energetic particle beam in a treatment zone.

According to another aspect of an embodiment of the present disclosure, a method of processing a substrate, the method comprising: placing the substrate on a wafer stage within an ion beam system, the substrate having a top surface having a plurality of features, an edge and a bottom surface; igniting an energetic particle beam having a radial flux distribution over at least a portion of a major dimension thereof; stabilizing the energetic particle beam while the bottom surface of the substrate is oriented toward the major dimension of the energetic particle beam; orienting the wafer stage with the substrate so that the top surface of the substrate is exposed to the major dimension of the energetic particle beam; and exposing the plurality of features on the top surface of the substrate to the energetic particle beam in a treatment zone.

According to another aspect of an embodiment of the present disclosure, a method for preventing electrostatic damage to a substrate within an ion beam etching system comprising the steps of: placing the substrate on a wafer stage within the ion beam etching system, the substrate having a top surface having a plurality of devices; generating an ion beam from an ion source within the ion beam etching system; generating an electron current from an electron source within the ion beam etching system; exposing the plurality of devices on the top surface of the substrate to the generated ion beam; and reducing an ion energy to the ion source to less than 20 electron volts at an etch completion while at least one of the devices of the plurality of devices on the top surface of the substrate is exposed to a portion of the generated ion beam.)

According to another aspect of an embodiment of the present disclosure, a method for preventing electrostatic damage to a substrate within an ion beam etching system comprising the steps of: placing the substrate on a wafer stage within the ion beam etching system, the substrate having a top surface having a plurality of devices; generating an ion beam from an ion source within the ion beam etching system; generating an electron current from an electron source within the ion beam etching system; exposing the plurality of devices on the top surface of the substrate to the generated ion beam; and turning off the ion source at an etch completion while at least one of the devices of the plurality of devices on the top surface of the substrate was being exposed to a portion of the generated ion beam.

According to another aspect of an embodiment of the present disclosure, a method for preventing electrostatic damage to a substrate within an ion beam etching system comprising the steps of: placing the substrate on a wafer stage within the ion beam etching system, the substrate having a top surface having a plurality of devices; generating an electron current from an electron source within the ion beam etching system by increasing an electron discharge from the electron source to greater than 2 electron volts; generating an ion beam from an ion source within the ion beam etching system by increasing an ion energy to an ion source to greater than 75 electron volts after the electron discharge from the electron source is greater than 2 electron volts while exposing at least one device of the plurality of devices on the top surface of the substrate to the generated ion beam; and reducing the ion energy of the ion source to less than 20 electron volts at an etch completion while at least one device of the plurality of devices on the top surface of the substrate is exposed to a portion of the generated ion beam.

According to another aspect of an embodiment of the present disclosure, a method for preventing electrostatic damage to a substrate within an ion beam etching system comprising the steps of: placing the substrate on a wafer stage within the ion beam etching system, the substrate having a top surface having a plurality of devices; generating an electron current from an electron source within the ion beam etching system; generating an ion beam from an ion source within the ion beam etching system after generating the electron current from the electron source while exposing at least one device of the plurality of devices on the top surface of the substrate to the generated ion beam; and turning off the ion source at an etch completion while at least one of the devices of the plurality of devices on the top surface of the substrate was being exposed to a portion of the generated ion beam.

According to another aspect of an embodiment of the present disclosure, a method for preventing electrostatic damage to a substrate within an ion beam deposition system comprising the steps of: placing the substrate on a wafer stage within the ion beam deposition system, the substrate having a top surface having a plurality of devices; generating a first ion beam from a first ion source within the ion beam deposition system; directing the first ion beam at a target material within the ion beam deposition system whereby a portion of the target material is sputtered toward the substrate as part of a deposition plume; exposing the plurality of devices on the top surface of the substrate to the deposition plume; generating a second ion beam from a second ion source within the ion beam deposition system; directing the second ion beam toward the substrate; generating an electron current from an electron source within the ion beam deposition system; directing a portion of the electron current toward the second ion beam; and reducing an ion energy from the second ion source to less than 20 electron volts at a deposition ion assist completion while at least one of the devices of the plurality of devices on the top surface of the substrate is exposed to the second ion beam.

According to another aspect of an embodiment of the present disclosure, a method for preventing electrostatic damage to a substrate within an ion beam deposition system comprising the steps of: placing the substrate on a wafer stage within the ion beam deposition system, the substrate having a top surface having a plurality of devices; generating a first ion beam from a first ion source within the ion beam deposition system; directing the first ion beam at a target material within the ion beam deposition system whereby a portion of the target material is sputtered toward the substrate as part of a deposition plume; exposing the plurality of devices on the top surface of the substrate to the deposition plume; generating a second ion beam from a second ion source within the ion beam deposition system; directing the second ion beam toward the substrate; generating an electron current from an electron source within the ion beam deposition system; directing a portion of the electron current toward the second ion beam; and turning off the second ion source at a deposition ion assist completion while at least one of the devices of the plurality of devices on the top surface of the substrate was being exposed to the second ion beam.

According to another aspect of an embodiment of the present disclosure, a method for preventing electrostatic damage to a substrate within an ion beam deposition system comprising the steps of: placing the substrate on a wafer stage within the ion beam deposition system, the substrate having a top surface having a plurality of devices; generating a first ion beam from a first ion source within the ion beam deposition system; directing the first ion beam at a target material within the ion beam deposition system whereby a portion of the target material is sputtered toward the substrate as part of a deposition plume; exposing the plurality of devices on the top surface of the substrate to the deposition plume; generating a second ion beam from a second ion source within the ion beam deposition system, the second ion source having an ion energy less than 20 electron volts; directing the second ion beam toward the substrate; generating an electron current from an electron source within the ion beam deposition system, the electron source having an electron discharge of less than 2 electron volts; directing a portion of the electron current toward the second ion beam; increasing the electron current from the electron source by increasing the electron discharge from the electron source to greater than 2 electron volts; increasing the ion energy to the second ion source to greater than 20 electron volts after the electron discharge from the electron source is greater than 2 electron volts while exposing at least one device of the plurality of devices on the top surface of the substrate to the second ion beam; and reducing the ion energy of the second ion source to less than 20 electron volts at a deposition ion assist completion while at least one device of the plurality of devices on the top surface of the substrate is exposed to the second ion beam.

According to another aspect of an embodiment of the present disclosure, a method for preventing electrostatic damage to a substrate within an ion beam deposition system comprising the steps of: placing the substrate on a wafer stage within the ion beam deposition system, the substrate having a top surface having a plurality of devices; generating a first ion beam from a first ion source within the ion beam deposition system; directing the first ion beam at a target material within the ion beam deposition system whereby a portion of the target material is sputtered toward the substrate as part of a deposition plume; exposing the plurality of devices on the top surface of the substrate to the deposition plume; generating a second ion beam from a second ion source within the ion beam deposition system; directing the second ion beam toward the substrate; generating a second ion beam from a second ion source within the ion beam deposition system; directing the second ion beam toward the substrate; generating an electron current from an electron source within the ion beam deposition system; directing a portion of the electron current toward the second ion beam; and turning off the second ion source at a deposition ion assist completion while at least one of the devices of the plurality of devices on the top surface of the substrate was being exposed to the second ion beam.

Additional features and advantages of the disclosure will be set forth in the description which follows, and in part will be obvious from the description, or can be learned by practice of the herein disclosed principles. The features and advantages of the disclosure can be realized and obtained by means of the instruments and combinations particularly pointed out in the appended claims. These and other features of the disclosure will become more fully apparent from the following description and appended claims, or can be learned by the practice of the principles set forth herein.

BRIEF DESCRIPTION OF THE DRAWINGS

In order to describe the manner in which the above-recited and other advantages and features of the disclosure can be obtained, a more particular description of the principles briefly described above will be rendered by reference to specific embodiments thereof which are illustrated in the appended drawings. Understanding that these drawings depict only exemplary embodiments of the disclosure and are not therefore to be considered to be limiting of its scope, the principles herein are described and explained with additional specificity and detail through the use of the accompanying drawings in which.

Figure 2A:
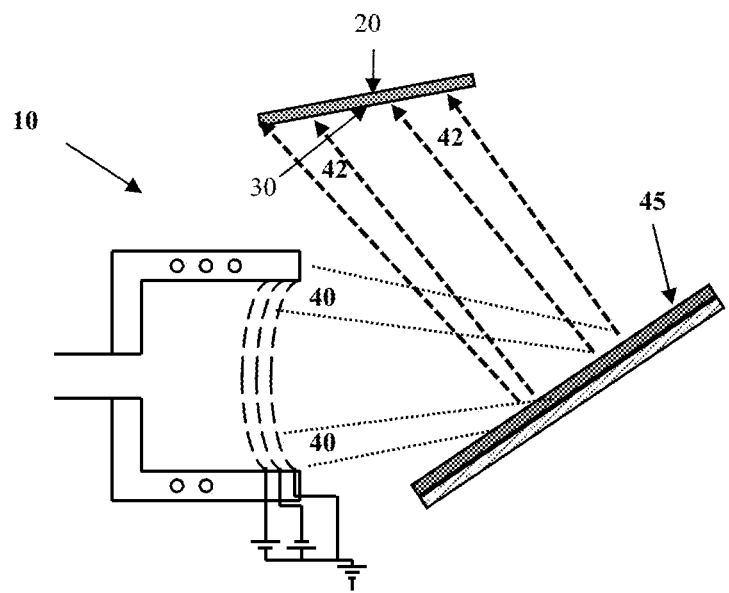

1B illustrates an ion beam etching system method according to one embodiment of the present invention;

FIG. 2A illustrates a typical prior art ion beam deposition system; and

Figure 2B:
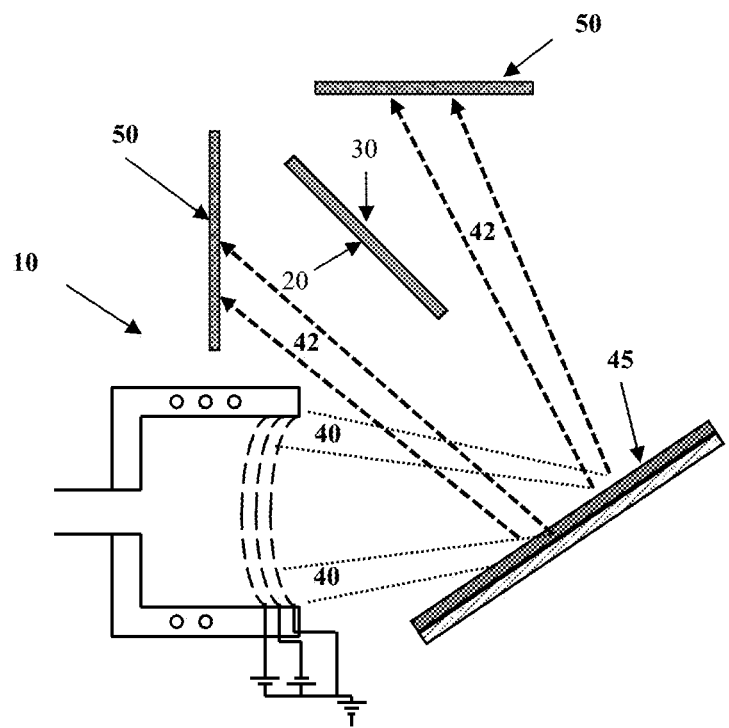

FIG. 2B illustrates an ion beam deposition system method according to one embodiment of the present invention.

Similar reference characters refer to similar parts throughout the several views of the drawings.

DETAILED DESCRIPTION

Present ion beam systems have added cost for the use of a physical shutter due to the motion axis for the shutter; periodic maintenance of the physical shutter; and an additional vacuum feedthrough for the physical shutter. Further, the use of a physical shutter limits the tilt angle range of the substrate due to constraints of space required to open the physical shutter. Lastly, a physical shutter reduces system reliability due to the proximity to substrate surface which results in potential particle generation on the substrate from the physical shutter.

In Ion Beam systems that have substrate tilt and rotate capability, the need for a physical shutter can be eliminated by tilting the substrate to a "hide" position as described in the present invention.

When substrate is tilted to the hide position, there is very little amount of etching of the substrate or deposition on the substrate within the respective ion beam system. However, at the hide position, if the substrate is not rotated, some areas of the substrate may still see small, yet measurable amounts of etch or deposition in some areas of the substrate. Thus, by rotation of the substrate while at the hide position, the amount of etch or deposition can be virtually eliminated.

In Ion Beam systems, the parasitic etch of the substrate or the deposition on the substrate during ignition of the ion source and stabilization of the ion source can be virtually eliminated by tilting the substrate to the hide position and rotating the substrate during any exposure to the ion beam. After the ion source is stabilized, the ion source may be allowed to run without ion extraction, while the wafer stage is tilted to the processing tilt angle, and once at the processing tilt angle, the substrate may be exposed to the ion beam. A preferred way to run the ion source without ion extraction is to set the ion optics voltages to zero volts. In case of ion source instabilities, ion extraction energy may be set to zero volts, the substrate tilted to the hide position while the substrate is rotated. Then, the ion source may be re-stabilized and the process may be resumed. Tilt angles of equal or larger than 90 degree or less than or equal to minus 90 degrees of the substrate within the ion beam system allow little to no exposure of the substrate to the ion beam.

Figure 1A:
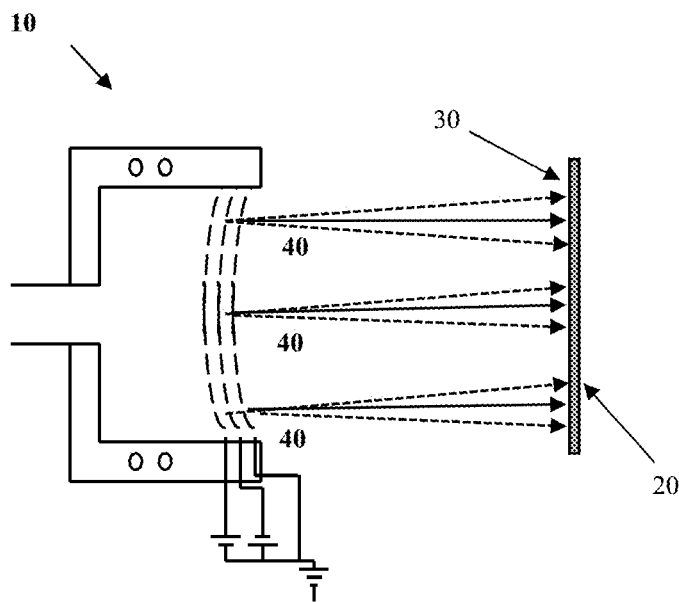
FIG. 1A illustrates a typical prior art ion beam etching system.
Figure 1B:
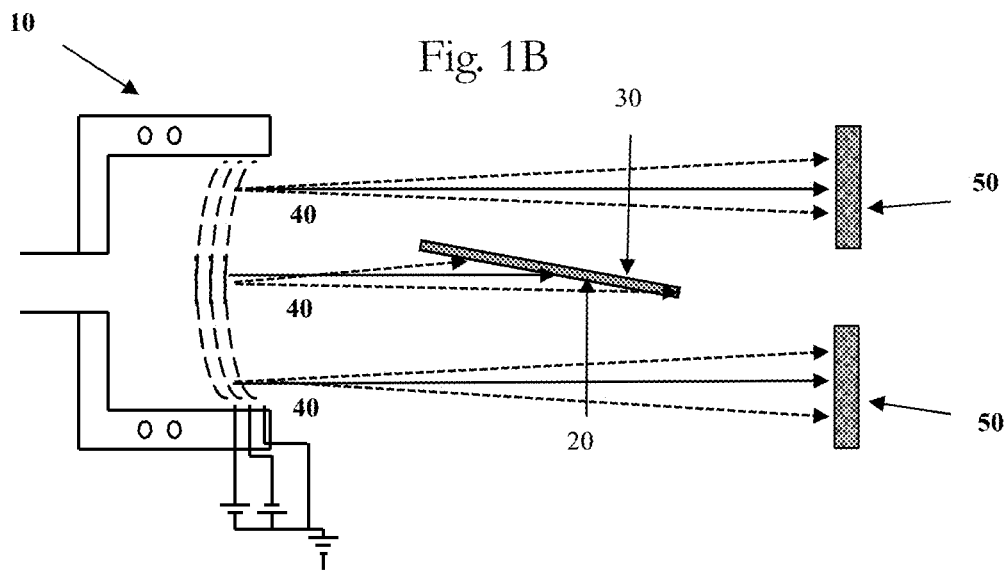

As shown in FIG. 1B, in one embodiment according to the present invention, a virtual shutter within an ion beam etching system 10 is achieved using a method of processing a substrate 30 wherein the substrate 30 is placed on a wafer stage 20 within the ion beam etching system 10. The substrate 30 has a top surface that has a plurality of features, an edge and a bottom surface. An energetic particle beam 40 having a radial flux distribution over at least a portion of a major dimension thereof is ignited within the ion beam etching system 10. The energetic particle beam 40 is stabilized while the wafer stage 20 with the substrate 30 is oriented so that the top surface of the substrate 30 is at an angle of greater than 90 degrees to the major dimension of the energetic particle beam 40 or less than minus 90 degree to the major dimension of the energetic particle beam 40. The stabilization of the energetic particle beam 40 can be performed for a time period of at least 1 second. The substrate 30 can be rotated during the stabilization of the energetic particle beam 40. After the stabilization of the energetic particle beam, the wafer stage 20 with the substrate 30 is oriented so that the top surface of the substrate 30 is at an angle greater than 90 degrees or less than minus 90 degrees to the major dimension of the energetic particle beam 40. Then, the plurality of features on the top surface of the substrate 30 are exposed to the energetic particle beam 40 while the wafer stage 20 with the substrate 30 is oriented so that the top surface of the substrate 30 is at an angle greater than 90 degrees or less than minus 90 degrees to the major dimension of the energetic particle beam 40 in a treatment zone.

As shown in FIG. 2B, in one embodiment according to the present invention, a virtual shutter within an ion beam deposition system 10 is achieved using a method of processing a substrate 30 wherein the substrate 30 is placed on a wafer stage 20 within the ion beam deposition system 10. The substrate 30 has a top surface that has a plurality of features, an edge and a bottom surface. An energetic particle beam 40 is ignited within the ion beam deposition system 10. The energetic particle beam 40 is focused on a sputtering target 45 which results an energetic particle beam of sputtered material 42 having a radial flux distribution over at least a portion of a major dimension thereof. The energetic particle beam of sputtered material 42 from the sputtering target 45 is stabilized while the wafer stage 20 with the substrate 30 is oriented so that the top surface of the substrate 30 is at an angle of greater than 90 degrees to the major dimension of the energetic particle beam of sputtered material 42 or less than minus 90 degree to the major dimension of the energetic particle beam of sputtered material 42. The stabilization of the energetic particle beam of sputtered material 42 can be performed for a time period of at least 1 second. The substrate 30 can be rotated during the stabilization of the energetic particle beam of sputtered material 42. After the stabilization of the energetic particle beam of sputtered material 42, the wafer stage 20 with the substrate 30 is oriented so that the top surface of the substrate 30 is at an angle greater than 90 degrees or less than minus 90 degrees to the major dimension of the energetic particle beam of sputtered material 42. Then, the plurality of features on the top surface of the substrate 30 are exposed to the energetic particle beam of sputtered material 42 while the wafer stage 20 with the substrate 30 is oriented so that the top surface of the substrate 30 is at an angle greater than 90 degrees or less than minus 90 degrees to the major dimension of the energetic particle beam of sputtered material 42 in a treatment zone.)

In one embodiment according to the present invention, a virtual shutter within an ion beam etching system 10 is achieved using a method of processing a substrate 30 wherein the substrate 30 is placed on a wafer stage 20 within the ion beam etching system 10. The substrate 30 has a top surface that has a plurality of features, an edge and a bottom surface. An energetic particle beam 40 having a radial flux distribution over at least a portion of a major dimension thereof is ignited within the ion beam etching system 10. The energetic particle beam 40 is stabilized while the edge of the substrate 30 is normal to the major dimension of the energetic particle beam 40 and while the edge of the substrate 30 is exposed to the energetic particle beam 40. The stabilization of the energetic particle beam 40 can be performed for a time period of at least 1 second. The substrate 30 can be rotated during the stabilization of the energetic particle beam 40. After the stabilization of the energetic particle beam 40, the wafer stage 20 with the substrate 30 is oriented so that the top surface of the substrate 30 is exposed to the major dimension of the energetic particle beam 40. Then, the plurality of features on the top surface of the substrate 30 are exposed to the energetic particle beam 40 in a treatment zone.

In one embodiment according to the present invention, a virtual shutter within an ion beam deposition system 10 is achieved using a method of processing a substrate 30 wherein the substrate 30 is placed on a wafer stage 20 within the ion beam deposition system 10. The substrate 30 has a top surface that has a plurality of features, an edge and a bottom surface. An energetic particle beam 40 is ignited within the ion beam deposition system 10. The energetic particle beam 40 is focused on a sputtering target 45 which results an energetic particle beam of sputtered material 42 having a radial flux distribution over at least a portion of a major dimension thereof. The energetic particle beam of sputtered material 42 from the sputtering target 45 is stabilized while the edge of the substrate 30 is normal to the major dimension of the energetic particle beam of sputtered material 42 and while the edge of the substrate 30 is exposed to the energetic particle beam of sputtered material 42. The stabilization of the energetic particle beam of sputtered material 42 can be performed for a time period of at least 1 second. The substrate 30 can be rotated during the stabilization of the energetic particle beam of sputtered material 42. After the stabilization of the energetic particle beam of sputtered material 42, the wafer stage 20 with the substrate 30 is oriented so that the top surface of the substrate 30 is exposed to the major dimension of the energetic particle beam of sputtered material 42. Then, the plurality of features on the top surface of the substrate 30 are exposed to the energetic particle beam of sputtered material 42 in a treatment zone.

In one embodiment according to the present invention, a virtual shutter within an ion beam etching system 10 is achieved using a method of processing a substrate 30 wherein the substrate 30 is placed on a wafer stage 20 within the ion beam etching system 10. The substrate 30 has a top surface that has a plurality of features, an edge and a bottom surface. An energetic particle beam 40 having a radial flux distribution over at least a portion of a major dimension thereof is ignited within the ion beam etching system 10. The energetic particle beam 40 is stabilized while the bottom surface of the substrate 30 is oriented toward the major dimension of the energetic particle beam 40. The stabilization of the energetic particle beam 40 can be performed for a time period of at least 1 second. The substrate 30 can be rotated during the stabilization of the energetic particle beam 40. After the stabilization of the energetic particle beam 40, the wafer stage 20 with the substrate 30 is oriented so that the top surface of the substrate 30 is exposed to the major dimension of the energetic particle beam 40. Then, the plurality of features on the top surface of the substrate 30 are exposed to the energetic particle beam 40 in a treatment zone.

In one embodiment according to the present invention, a virtual shutter within an ion beam deposition system 10 is achieved using a method of processing a substrate 30 wherein the substrate 30 is placed on a wafer stage 20 within the ion beam deposition system 10. The substrate 30 has a top surface that has a plurality of features, an edge and a bottom surface. An energetic particle beam 40 is ignited within the ion beam deposition system 10. The energetic particle beam 40 is focused on a sputtering target 45 which results an energetic particle beam of sputtered material 42 having a radial flux distribution over at least a portion of a major dimension thereof. The energetic particle beam of sputtered material 42 from the sputtering target 45 is stabilized while the bottom surface of the substrate 30 is oriented toward the major dimension of the energetic particle beam of sputtered material 42. The stabilization of the energetic particle beam of sputtered material 42 can be performed for a time period of at least 1 second. The substrate 30 can be rotated during the stabilization of the energetic particle beam of sputtered material 42. After the stabilization of the energetic particle beam of sputtered material 42, the wafer stage 20 with the substrate 30 is oriented so that the top surface of the substrate 30 is exposed to the major dimension of the energetic particle beam of sputtered material 42. Then, the plurality of features on the top surface of the substrate 30 are exposed to the energetic particle beam of sputtered material 42 in a treatment zone.

Low process pressure within the ion beam etch system makes for a long "mean free path" relative to the distance to the substrate from the ion source. Ion beam etch processes are directional. This allows the substrate to be tilted to angles that can reduce etching of the substrate. For example, the substrate may be tilted so that the substrate surface has no line of sight to the ion source. This may be done by tilting the substrate to angles greater than or equal to 90 degrees, or angles less than or equal to negative 90 degrees to the major dimension of the particle beam (ions from the ion source). The substrate being held in such positions during the ion source ignition allows little to no exposure of the substrate to ions from the ion source.

Low process pressure within the ion beam deposition system makes for a long "mean free path" relative to the distance to the substrate from the target. Ion beam deposition processes are directional. This allows the substrate to be tilted to angles that can reduce deposition on the substrate. For example, the substrate may be tilted so that the substrate surface has no line of sight to the target. This may be done by tilting the substrate to angles greater than or equal to 90 degrees, or angles less than or equal to negative 90 degrees to major dimension of the particle beam (sputtered material from the target). The substrate being held in such positions during the ion source ignition allows little to no exposure of the substrate to sputtered material from the target.

In any embodiment of the present invention, exposure of the substrate to ions from the ion source in these positions may be further reduced by use of a low sputter yield material in areas of the process chamber where there is a line of sight of both the substrate surface and the ion source. Low sputter yield material absorbers may be placed strategically in areas that are in line of sight of both the substrate surface in hide position and the ion source in case of ion beam etch to further minimize substrate etching in hide position. Alternatively, low sputter yield material absorbers may be placed strategically in areas that are in line of sight of both the substrate surface in the hide position and the target in case of ion beam deposition.

In any embodiment of the present invention, typical source stabilization time is less than 10 seconds. Thus, the substrate will experience about 1 angstrom of etch or deposition at the hide position with rotation, during the ion source ignition and stabilization process.

In any embodiment of the present invention, in an ion beam deposition system, the targets may be cleaned and preconditioned while the substrate is tilted to the hide position. Additionally, the substrate can be rotated during the cleaning and/or preconditioning of the target.

In any embodiment of the present invention, the voltage to a beam grid can be reduced while the wafer stage with the substrate is being brought into a processing position and while a plasma remains ignited. Alternatively, the voltage to a beam grid can be reduced and the voltage to a suppressor grid can be reduced while the wafer stage with the substrate is being brought into a processing position and while a plasma remains ignited.)

In any embodiment of the present invention, the stage that holds the substrate during exposure to the sputtered material from the target can rotate the substrate about a central axis. The stage can tilt the substrate with respect to the sputtered material for at least a portion of the deposition process. The deposition plume of sputtered material from the target can be directed at any angle with respect to the substrate surface by tilting the substrate stage. Provisions may be made on the wafer stage to cool the substrate during the deposition process to prevent thermal damage to the devices on the substrate. The substrate may also be heated to a specific temperature to enhance the ion beam deposition process.

In Ion Beam Etch (IBE) systems, wafers are etched by exposing the wafer to energetic ions that are extracted from an ion source. A low energy electron source provides electrons that flood the wafer surface and prevent the buildup of electrical potential on the wafer surface, and protect the wafer from electrostatic discharge (ESD) damage to the wafer.

In the absence of electrons from the electron source, positive potential can buildup on the wafer surface. The maximum value of the potential buildup can equal the potential of the ions hitting the wafer. Electrons being supplied by the electrons source, neutralize the potential buildup of electrostatic charge, and prevent ESD at the wafer.

Traditionally, an IBE system is configured with a physical shutter that is grounded. The shutter is closed prior to shutting off the ion source which prevents ESD to the wafer.

However, when an IBE system does not have a grounded physical shutter, termination of the ion etch process must follow strict sequences to avoid ESD damage to wafer. When the ion beam etching process is terminated without a grounded physical shutter, if the ion source and the electron source are both commanded to be turned off simultaneously, the actual sequence of termination may result in ions being extracted from the ion source for a period of time beyond when the electron flow from the electron source has stopped. In a shutterless ion beam etching system, this can result in a positive potential being built up on the wafer causing ESD damage to the wafer.

In order to prevent ESD on the wafer in a shutterless ion beam etching system, the method of the present invention sequences the process termination in the following order: ion source is turned off prior to turning off the electron source. The ion source may be turned off up to 50 milliseconds earlier than the electron source. This sequencing assures that no positive potential can buildup on the wafer since electrons being extracted from the electron source are low energy electrons; as such, the negative potential buildup on the wafer is below the threshold for ESD on the wafer.

There are several variants of ion sources and ion extraction grids are available, e.g., DC discharge ion source, RF ICP discharge ion source, 2-grid, 3-grid, 4-grid systems, etc. Ions are typically extracted from the ion source at energies greater than 75 electron volts up to 2000 electron volts. The beam grid voltage (inner most grid of the grid assembly) determines the ion energy. Ion beam energy can be changed by changing the voltage on the beam grid. The ion energy can be brought to below ESD threshold by switching the beam grid voltage to below the threshold for ESD. The ion source can be switched off by switching off the gas flow or by switching off the RF power to the plasma.

There are several variants available for the electron source, e.g., thermionic emission from a hot filament, Plasma Discharge source of electrons, RF ICP discharge source, etc. Typically, electrons are extracted from the electron source. The electron current in excess of ion beam current is needed to prevent ESD damage on the wafer. The electron source body voltage determines the electron energy. Typical electron energy is very low, e.g., less than 10 electron volts. The electron source can be switched off by switching off the discharge voltage or by switching off the gas flow to the electron source. The electron current can also be turned off by switching off the body voltage even when the discharge is still on.

In a shutterless ion beam etching system, ESD prevention is based on avoiding a potential buildup of a positive charge on the wafer by lowering the ion energy to below the ESD threshold by setting the beam voltage to a very low value below the threshold for ESD on the wafer. The beam voltage may be set to below the ESD threshold for at least 50 milliseconds prior to switching off the ion source and the electron source. Then, the ion source and the electron source may be turned off in any sequence after setting the beam voltage to a very low value below the threshold for ESD on the wafer without waiting for the ion source plasma to be turned off.

In any embodiment described herein, in a shutterless ion beam etching system, ESD prevention can be achieved by tilting the wafer away from the process position to face away from the ion source preferably by greater than or equal to 90 degrees. This prevents any ions from hitting the wafer, and thus prevents ESD on the wafer. Once the wafer is tilted away from the process position by greater than or equal to 90 degrees, the ion source and the electron source can be turned off in any sequence without causing ESD on wafer.)

In any embodiment described herein, in a shutterless ion beam etching system, ESD prevention can be achieved by moving the wafer into a "hide" position by moving the wafer to a position outside of the ion beam. Once the wafer is moved outside the process position, the ion source and the electron source can be turned off in any sequence without causing ESD on wafer. Ion beam voltage may also be brought to below ESD threshold level at the process termination, wafer may be translated to the "wafer hide position" and the ion source and the electron source may be turned off in any sequence without causing wafer ESD.

Traditionally, an ion assisted ion beam deposition IBD system is configured with a physical shutter that is grounded. The shutter is closed prior to shutting off the ion assist source which prevents ESD to the wafer.

However, when an ion assisted IBD system does not have a grounded physical shutter, termination of the ion assist process must follow strict sequences to avoid ESD damage to wafer. When the ion assist process is terminated in an IBD system, if both the ion assist source and electron assist source are commanded to be turned off simultaneously, the actual sequence of termination may result in ions from the ion assist source being extracted for a period of time beyond when electron flow from the electron assist source has stopped. In a shutterless ion assisted IBD system, this can result in a positive potential being built up on the wafer causing ESD damage to the wafer.

In order to prevent ESD on the wafer in a shutterless ion assisted IBD system, the method of the present invention sequences the process termination in the following order: the ion assist source is turned off prior to turning off the electron assist source. The ion assist source may be turned off up to 50 milliseconds prior to turning off the electron assist source. This sequencing assures that no positive potential can buildup on the wafer since electrons being extracted from the electron assist source are low energy electrons; as such, the negative potential buildup on the wafer is below the threshold for ESD on the wafer.

In a shutterless ion assisted IBD system, ESD prevention is based on avoiding a potential buildup of a positive charge on the wafer by lowering the ion energy from the ion assist source to below the ESD threshold by setting the beam voltage to the ion assist source to a very low value below the threshold for ESD on the wafer. The beam assist voltage may be set to below the ESD threshold for at least 50 milliseconds prior to switching off the ion assist source and the electron assist source. Then, the ion assist source and the electron assist source may be turned off in any sequence after setting the beam assist voltage to a very low value below the threshold for ESD on the wafer without waiting for the ion assist source plasma to be turned off.

In any embodiment described herein, in a shutterless ion assisted IBD system, ESD prevention can be achieved by tilting the wafer away from the process position to face away from the ion assist source preferably by greater than or equal to 90 degrees. This prevents any ions from hitting the wafer, and thus prevents ESD on the wafer. Once the wafer is tilted away from the process position by greater than or equal to 90 degrees, the ion assist source and electron assist source may be turned off in any sequence without causing ESD on wafer.

In any embodiment described herein, in a shutterless ion assisted IBD system, ESD prevention can be achieved by moving the wafer into a "hide" position by moving the wafer to a position outside of the ion assist beam. Once the wafer is moved outside the process position, the ion assist source and the electron assist source can be turned off in any sequence without causing ESD on wafer. Ion assist beam voltage may also be brought to below ESD threshold level at the process termination, wafer may be translated to the "wafer hide position" and the ion assist source and the electron assist source may be turned off in any sequence without causing wafer ESD.

In IBD, deposition of thin films on wafers is carried out by sputtering material from a target that is bombarded by an ion beam extracted from a deposition ion source. Sputtered material is collected on a wafer mounted on a stage that may tilt and rotate. ESD is not an issue in IBD since the wafer is not directly exposed to the ion beam. However, in an ion assisted IBD system without a physical grounded shutter, the wafer can be exposed to ESD if the ion assisted IBD process is not properly terminated.

In ion assisted IBD process, the wafer is exposed to an ion assist source that directs an ion assist beam extracted from the ion assist source at the wafer. The ion assist beam helps modify the properties of the thin films being deposited on wafer in the IBD system. These properties may include crystal structure, film density, film composition and stoichiometry, etc. An electron assist source comprising of very low energy electrons allows electrons to flood the wafer surface and prevents the buildup of electrical potential on the wafer surface, and protects the wafer from electrostatic discharge (ESD) damage to the wafer. In the absence of electrons from the electron assist source, a positive potential can buildup on the wafer surface from exposure to the ion assist beam from the ion assist source. The maximum value of the potential buildup can equal the potential of the ions hitting the wafer. Electrons being supplied by the electron assist source neutralize the potential buildup and prevent ESD at the wafer during the ion assist IBD process.

For the ion assist source, there are several variants of ion assist sources and ion extraction grids are available, e.g., DC discharge ion assist source, RF ICP discharge ion assist source, 2-grid, 3-grid, 4-grid systems, etc. Ions are typically extracted from the ion assist source at energies greater than 50 electron volts up to several hundred electron volts. The beam assist grid voltage (inner most grid of the grid assembly) determines the ion assist energy. The ion assist beam energy can be changed by changing the voltage on the beam assist grid. The ion assist beam energy can be brought to below ESD threshold by switching the beam assist grid voltage to below the threshold for ESD. The ion assist source can be switched off by switching off the gas flow or by switching off the RF power to the plasma.)

There are several variants available for the electron assist source, e.g., thermionic emission from a hot filament, Plasma Discharge source of electrons, RF ICP discharge source, etc. Typically, electrons are extracted from the electron assist source. The electron current in excess of ion assist beam current is needed to prevent ESD damage on the wafer. The electron assist source body voltage determines the electron assist energy. Typical electron assist energy is very low, e.g., less than 10 electron volts. The electron assist source can be switched off by switching off the discharge voltage or by switching off the gas flow to the electron assist source. The electron assist current can also be turned off by switching off the body voltage even when the discharge is still on.

In one embodiment according to the present invention, the prevention of electrostatic damage to a substrate within an ion beam etching system that does not have a grounded physical shutter is achieved by using a method of placing the substrate on a wafer stage within the ion beam etching system. The substrate has a top surface that has a plurality of devices. An ion beam having a radial flux distribution over at least a portion of a major dimension thereof is generated within the ion beam etching system. An electron current is generated from an electron source within the ion beam etching system. The plurality of devices on the top surface of the substrate are exposed to the generated ion beam while the wafer stage with the substrate is oriented so that the top surface of the substrate is at an angle greater than 90 degrees or less than minus 90 degrees to the major dimension of the generated ion beam in a treatment zone. At an etch completion, the ion energy to the ion source is reduced to less than 20 electron volts while at least one of the devices of the plurality of devices on the top surface of the substrate is exposed to a portion of the generated ion beam. The method can further comprise reducing a discharge energy from the electron source to less than 20 electron volts after the ion energy to the ion source has been reduced to less than 20 electron volts at the etch completion step. Alternatively, the discharge energy from the electron source can be reduced to the discharge energy of less than 20 electron volts within 50 milliseconds of the ion energy being reduced to less than 20 electron volts at the etch completion step. The method can further comprise turning off the ion source first and then turning off the electron source after the discharge energy from the electron source is reduced to the discharge energy of less than 20 electron volts at the etch completion step.

In one embodiment according to the present invention, the prevention of electrostatic damage to a substrate within an ion beam etching system that does not have a grounded physical shutter is achieved by using a method of placing the substrate on a wafer stage within the ion beam etching system. The substrate has a top surface that has a plurality of devices. An ion beam having a radial flux distribution over at least a portion of a major dimension thereof is generated within the ion beam etching system. An electron current is generated from an electron source within the ion beam etching system. The plurality of devices on the top surface of the substrate are exposed to the generated ion beam while the wafer stage with the substrate is oriented so that the top surface of the substrate is at an angle greater than 90 degrees or less than minus 90 degrees to the major dimension of the generated ion beam in a treatment zone. At an etch completion, the ion source is turned off while at least one of the devices of the plurality of devices on the top surface of the substrate was being exposed to a portion of the generated ion beam. The method can further comprise turning off the electron source after the ion source has been turned off at the etch completion step. Alternatively, the electron source is turned off within 50 milliseconds of turning off the ion source at the etch completion step.

In one embodiment according to the present invention, the prevention of electrostatic damage to a substrate within an ion beam etching system that does not have a grounded physical shutter is achieved by using a method of placing the substrate on a wafer stage within the ion beam etching system. The substrate has a top surface that has a plurality of devices. An electron current is generated from an electron source within the ion beam etching system by increasing an electron discharge from the electron source to greater than 2 electron volts. An ion beam having a radial flux distribution over at least a portion of a major dimension thereof is generated within the ion beam etching system by increasing an ion energy to an ion source to greater than 75 electron volts after the electron discharge from the electron source is greater than 2 electron volts while exposing at least one device of the plurality of devices on the top surface of the substrate to the generated ion beam. The plurality of devices on the top surface of the substrate are exposed to the generated ion beam while the wafer stage with the substrate is oriented so that the top surface of the substrate is at an angle greater than 90 degrees or less than minus 90 degrees to the major dimension of the generated ion beam in a treatment zone. At an etch completion, the ion energy to the ion source is reduced to less than 20 electron volts while at least one of the devices of the plurality of devices on the top surface of the substrate is exposed to a portion of the generated ion beam. The method can further comprise reducing a discharge energy from the electron source to less than 20 electron volts after the ion energy to the ion source has been reduced to less than 20 electron volts at the etch completion step. Alternatively, the discharge energy from the electron source can be reduced to the discharge energy of less than 20 electron volts within 50 milliseconds of the ion energy being reduced to less than 20 electron volts at the etch completion step. The method can further comprise turning off the ion source first and then turning off the electron source after the discharge energy from the electron source is reduced to the discharge energy of less than 20 electron volts at the etch completion step.

In one embodiment according to the present invention, the prevention of electrostatic damage to a substrate within an ion beam etching system that does not have a grounded physical shutter is achieved by using a method of placing the substrate on a wafer stage within the ion beam etching system. The substrate has a top surface that has a plurality of devices. An electron current is generated from an electron source within the ion beam etching system. An ion beam having a radial flux distribution over at least a portion of a major dimension thereof is generated within the ion beam etching system after generating the electron current from the electron source while exposing at least one device of the plurality of devices on the top surface of the substrate to the generated ion beam. The plurality of devices on the top surface of the substrate are exposed to the generated ion beam while the wafer stage with the substrate is oriented so that the top surface of the substrate is at an angle greater than 90 degrees or less than minus 90 degrees to the major dimension of the generated ion beam in a treatment zone. At an etch completion, the ion source is turned off while at least one of the devices of the plurality of devices on the top surface of the substrate was being exposed to a portion of the generated ion beam. The method can further comprise turning off the electron source after the ion source has been turned off at the etch completion step. Alternatively, the electron source can be turned off within 50 milliseconds of turning off the ion source at the etch completion step.

In one embodiment according to the present invention, the prevention of electrostatic damage to a substrate within a shutterless ion assisted ion beam deposition system is achieved by using a method of placing the substrate on a wafer stage within the ion beam deposition system. The substrate has a top surface that has a plurality of devices. A first ion beam is generated from a first ion source within the ion beam deposition system. The first ion beam is directed at a target material within the ion beam deposition system whereby a portion of the target material is sputtered toward the substrate as part of a deposition plume. The plurality of devices on the top surface of the substrate are exposed to the deposition plume. A second ion beam from a second ion source is generated within the ion beam deposition system. The second ion beam is directed toward the substrate. An electron current from an electron source is generated within the ion beam deposition system. A portion of the electron current is directed toward the second ion beam. At a deposition ion assist completion, the ion energy from the second ion source is reduced to less than 20 electron volts while at least one of the devices of the plurality of devices on the top surface of the substrate is exposed to the second ion beam. The method can further comprise reducing a discharge energy from the electron source to less than 20 electron volts after the ion energy to the second ion source has been reduced to less than 20 electron volts at the deposition ion assist completion step. Alternatively, the discharge energy from the electron source can be reduced to the discharge energy of less than 20 electron volts within 50 milliseconds of the ion energy to the second ion source being reduced to less than 20 electron volts at the deposition ion assist completion step. The method can further comprise turning off the second ion source first and then turning off the electron source after the discharge energy from the electron source is reduced to the discharge energy of less than 20 electron volts at the deposition ion assist completion step.

In one embodiment according to the present invention, the prevention of electrostatic damage to a substrate within a shutterless ion assisted ion beam deposition system is achieved by using a method of placing the substrate on a wafer stage within the ion beam deposition system. The substrate has a top surface that has a plurality of devices. A first ion beam is generated from a first ion source within the ion beam deposition system. The first ion beam is directed at a target material within the ion beam deposition system whereby a portion of the target material is sputtered toward the substrate as part of a deposition plume. The plurality of devices on the top surface of the substrate are exposed to the deposition plume. A second ion beam from a second ion source is generated within the ion beam deposition system. The second ion beam is directed toward the substrate. An electron current from an electron source is generated within the ion beam deposition system. A portion of the electron current is directed toward the second ion beam. At a deposition ion assist completion, the second ion source is turned off while at least one of the devices of the plurality of devices on the top surface of the substrate was being exposed to the second ion beam. The method can further comprise turning off the electron source after the second ion source has been turned off at the deposition ion assist completion step. Alternatively, the electron source can be turned off within 50 milliseconds of turning off the second ion source at the deposition ion assist completion step.

In one embodiment according to the present invention, the prevention of electrostatic damage to a substrate within a shutterless ion assisted ion beam deposition system is achieved by using a method of placing the substrate on a wafer stage within the ion beam deposition system. The substrate has a top surface that has a plurality of devices. A first ion beam is generated from a first ion source within the ion beam deposition system. The first ion beam is directed at a target material within the ion beam deposition system whereby a portion of the target material is sputtered toward the substrate as part of a deposition plume. The plurality of devices on the top surface of the substrate are exposed to the deposition plume. A second ion beam from a second ion source is generated within the ion beam deposition system. The second ion source has an ion energy of less than 20 electron volts. The second ion beam is directed toward the substrate. An electron current from an electron source is generated within the ion beam deposition system. The electron source has an electron discharge of less than 2 electron volts. A portion of the electron current is directed toward the second ion beam. The electron current from the electron source is increased by increasing the electron discharge from the electron source to greater than 2 electron volts. The ion energy to the second ion source is increased to greater than 20 electron volts after the electron discharge from the electron source is greater than 2 electron volts while exposing at least one device of the plurality of devices on the top surface of the substrate to the second ion beam. At a deposition ion assist completion, the ion energy from the second ion source is reduced to less than 20 electron volts while at least one of the devices of the plurality of devices on the top surface of the substrate is exposed to the second ion beam. The method can further comprise reducing a discharge energy from the electron source to less than 20 electron volts after the ion energy to the second ion source has been reduced to less than 20 electron volts at the deposition ion assist completion step. Alternatively, the discharge energy from the electron source can be reduced to the discharge energy of less than 20 electron volts within 50 milliseconds of the ion energy to the second ion source being reduced to less than 20 electron volts at the deposition ion assist completion step. The method can further comprise turning off the second ion source first and then turning off the electron source after the discharge energy from the electron source is reduced to the discharge energy of less than 20 electron volts at the deposition ion assist completion step.

In one embodiment according to the present invention, the prevention of electrostatic damage to a substrate within a shutterless ion assisted ion beam deposition system is achieved by using a method of placing the substrate on a wafer stage within the ion beam deposition system. The substrate has a top surface that has a plurality of devices. A first ion beam is generated from a first ion source within the ion beam deposition system. The first ion beam is directed at a target material within the ion beam deposition system whereby a portion of the target material is sputtered toward the substrate as part of a deposition plume. The plurality of devices on the top surface of the substrate are exposed to the deposition plume. A second ion beam from a second ion source is generated within the ion beam deposition system. The second ion beam is directed toward the substrate. An electron current from an electron source is generated within the ion beam deposition system. A portion of the electron current is directed toward the second ion beam. At a deposition ion assist completion, the second ion source is turned off while at least one of the devices of the plurality of devices on the top surface of the substrate was being exposed to the second ion beam. The method can further comprise turning off the electron source after the second ion source has been turned off at the deposition ion assist completion step. Alternatively, the electron source can be turned off within 50 milliseconds of turning off the second ion source at the deposition ion assist completion step.

In any embodiment herein, etch completion in the ion beam etching system method can be defined as the point in the process that the desired endpoint of the etching process has been achieved.)

In any embodiment herein, the deposition ion assist completion in the ion assist beam deposition system method can be defined as the point in the process that the desired characteristics of the deposition process have been achieved.

Although a variety of examples and other information was used to explain aspects within the scope of the appended claims, no limitation of the claims should be implied based on particular features or arrangements in such examples, as one of ordinary skill would be able to use these examples to derive a wide variety of implementations. Further, and although some subject matter may have been described in language specific to examples of structural features and/or method steps, it is to be understood that the subject matter defined in the appended claims is not necessarily limited to these described features or acts. For example, such functionality can be distributed differently or performed in components other than those identified herein. Rather, the described features and steps are disclosed as examples of components of systems and methods within the scope of the appended claims. Moreover, claim language reciting "at least one of" a set indicates that one member of the set or multiple members of the set satisfy the claim.

What is claimed is:

1. A method for preventing electrostatic damage to a substrate within a shutterless ion beam etching system comprising the steps of:
   placing the substrate on a wafer stage within the shutterless ion beam etching system, the substrate having a top surface having a plurality of devices;
   generating an ion beam from an ion source within the shutterless ion beam etching system;
   generating an electron current from an electron source within the shutterless ion beam etching system;
   exposing the plurality of devices on the top surface of the substrate to the generated ion beam;
   moving the substrate into a hide position at an etch completion; and
   turning off the ion source after the substrate has moved to the hide position at the etch completion step.

2. The method according to claim 1 further comprising turning off the electron source after the ion source has been turned off at the etch completion step.

3. The method according to claim 2 wherein the electron source is turned off within 50 milliseconds of turning off the ion source at the etch completion step.

4. A method for preventing electrostatic damage to a substrate within a shutterless ion beam etching system comprising the steps of:
   placing the substrate on a wafer stage within the shutterless ion beam etching system, the substrate having a top surface having a plurality of devices;
   generating an electron current from an electron source within the shutterless ion beam etching system;
   generating an ion beam from an ion source within the shutterless ion beam etching system after generating the electron current from the electron source while exposing at least one device of the plurality of devices on the top surface of the substrate to the generated ion beam; and
   moving the substrate into a hide position at an etch completion; and
   turning off the ion source after the substrate has moved to the hide position at the etch completion step.

5. The method according to claim 4 further comprising turning off the electron source after the ion source has been turned off at the etch completion step.

6. The method according to claim 5 wherein the electron source is turned off within 50 milliseconds of turning off the ion source at the etch completion step.

* * * * *